(12) United States Patent
Chang et al.

(10) Patent No.: US 12,087,687 B2
(45) Date of Patent: Sep. 10, 2024

(54) SEMICONDUCTOR DEVICE AND FABRICATION METHOD THEREOF

(71) Applicant: United Semiconductor (Xiamen) Co., Ltd., Fujian (CN)

(72) Inventors: Wei-Chun Chang, Taichung (TW); You-Di Jhang, New Taipei (TW); Chin-Chun Huang, Hsinchu County (TW); Wen Yi Tan, Fujian (CN)

(73) Assignee: United Semiconductor (Xiamen) Co., Ltd., Fujian (CN)

( * ) Notice: Subject to any disclaimer, the term of this patent is extended or adjusted under 35 U.S.C. 154(b) by 366 days.

(21) Appl. No.: 17/555,520

(22) Filed: Dec. 20, 2021

(65) Prior Publication Data

US 2023/0145327 A1 May 11, 2023

(30) Foreign Application Priority Data

Nov. 9, 2021 (CN) .......................... 202111318939.9

(51) Int. Cl.
| | |
|---|---|
| *H01L 27/06* | (2006.01) |
| *H01L 23/522* | (2006.01) |
| *H01L 29/78* | (2006.01) |
| *H01L 23/532* | (2006.01) |
| *H01L 49/02* | (2006.01) |

(52) U.S. Cl.
CPC ...... *H01L 23/5228* (2013.01); *H01L 27/0688* (2013.01); *H01L 23/5226* (2013.01); *H01L 23/53228* (2013.01); *H01L 28/24* (2013.01)

(58) Field of Classification Search
CPC . H01L 27/0629; H01L 27/0924; H01L 28/20; H01L 23/5228; H01L 23/5226; H01L 23/53228; H01L 23/53295; H01L 27/0688; H01L 28/24; H01L 29/1079; H01L 29/1095; H01L 29/6681; H01L 29/785; H01L 29/66545; H01L 29/7851; H01L 29/7831
See application file for complete search history.

(56) References Cited

U.S. PATENT DOCUMENTS

| | | | |
|---|---|---|---|
| 10,381,345 B2 * | 8/2019 | Shin .................... | H01L 23/5283 |
| 2002/0185738 A1 * | 12/2002 | Kim .................. | H01L 21/76838 |
| | | | 257/E21.582 |
| 2011/0057267 A1 * | 3/2011 | Chuang ............. | H01L 29/66545 |
| | | | 257/E29.325 |
| 2013/0049168 A1 * | 2/2013 | Yang ................... | H01L 27/0629 |
| | | | 257/E27.024 |
| 2013/0052789 A1 * | 2/2013 | Huang ................... | H01L 28/20 |
| | | | 257/E21.09 |
| 2013/0200447 A1 * | 8/2013 | Yen ..................... | H01L 23/5228 |
| | | | 257/E27.06 |

(Continued)

*Primary Examiner* — Mary A Wilczewski
*Assistant Examiner* — Tsz K Chiu
(74) *Attorney, Agent, or Firm* — Winston Hsu

(57) ABSTRACT

A semiconductor device includes a resistor disposed on a second etching stop layer in the resistor forming region. A fourth interlayer dielectric layer covers the resistor and the second etch stop layer. A first via is located in the fourth interlayer dielectric layer and is electrically connected to a terminal of the resistor. By forming the resistor in BEOL process, the problem of the contact stop depth difference that affects the process window and causes the reduced yield can be improved.

9 Claims, 2 Drawing Sheets

(56) References Cited

U.S. PATENT DOCUMENTS

| | | | |
|---|---|---|---|
| 2013/0277754 A1* | 10/2013 | Liang | H01L 27/0629 |
| | | | 257/379 |
| 2014/0167181 A1* | 6/2014 | Xiong | H01L 27/0629 |
| | | | 257/379 |
| 2014/0264624 A1* | 9/2014 | Yen | H01L 27/0629 |
| | | | 257/379 |
| 2014/0264750 A1* | 9/2014 | Chang | H01L 28/60 |
| | | | 257/533 |
| 2015/0179729 A1* | 6/2015 | Xiao | H01L 28/24 |
| | | | 257/536 |
| 2015/0206902 A1* | 7/2015 | Cheng | H01L 21/28194 |
| | | | 257/296 |
| 2015/0349045 A1* | 12/2015 | Wang | H01L 28/20 |
| | | | 257/380 |
| 2016/0020148 A1* | 1/2016 | Song | H01L 23/5228 |
| | | | 438/238 |
| 2016/0204103 A1* | 7/2016 | Hung | H01L 27/0647 |
| | | | 257/536 |
| 2018/0190754 A1* | 7/2018 | Lin | H01L 21/32051 |
| 2018/0211952 A1* | 7/2018 | Shin | H01L 23/5228 |
| 2019/0006456 A1* | 1/2019 | Zhou | H01L 28/20 |
| 2022/0084955 A1* | 3/2022 | Liu | H01L 23/552 |
| 2023/0378166 A1* | 11/2023 | Lee | H01L 29/66795 |

* cited by examiner

SEMICONDUCTOR DEVICE AND FABRICATION METHOD THEREOF

BACKGROUND OF THE INVENTION

1. Field of the Invention

The present invention relates to a metal resistor used in a semiconductor integrated circuit, and more particularly to a semiconductor device embedded with a metal nitride resistor and a method of manufacturing the same.

2. Description of the Prior Art

In semiconductor integrated circuits (ICs), a resistor may be used to control the resistance of other electronic components of the IC.

Prior art resistors are typically composed of doped polysilicon. As the integration of semiconductor devices increases, each component within a semiconductor IC has to provide equivalent or better electrical properties. A downscaled resistor thus has to provide a constant resistance value that does not fluctuate much during use. However, due to the properties of polysilicon, a prior art resistor comprised of doped polysilicon can only provide a limited resistance within a limited space. Employing a polysilicon resistor to provide relatively tighter resistance tolerances then becomes a problem in designing and fabricating a highly integrated semiconductor device.

An embedded titanium nitride (TiN) resistor process has been developed in the 28 nm high-dielectric-constant mid-end process (middle-end-of-line, MEOL), which presents better wafer acceptance test resistance (WAT RS) and uniformity control than traditional doped polysilicon resistors. However, the drawback is that the difference in contact stop depth affects the process window, resulting in a decline in yield.

SUMMARY OF THE INVENTION

One aspect of the invention provides a semiconductor device including a substrate having a transistor forming region and a resistor forming region thereon; a transistor disposed on the substrate within the transistor forming region; a first inter-layer dielectric (ILD) layer covering the transistor forming region and the resistor forming region and around the transistor; a first etch stop layer disposed on the first ILD layer; a second inter-layer dielectric (ILD) layer disposed on the first etch stop layer; a contact plug in the second ILD layer, the first etch stop layer, and the first ILD layer to electrically connect with a terminal of the transistor; a third inter-layer dielectric (ILD) layer disposed on the second ILD layer; a first metal interconnect layer disposed in the third ILD layer and being electrically connected to the contact plug; a second etch stop layer disposed on the third ILD layer; a resistor disposed on the second etch stop layer within the resistor forming region; a fourth inter-layer dielectric (ILD) layer covering the resistor and the second etch stop layer; and a first via disposed in the fourth ILD layer and being electrically connect with a terminal of the resistor.

According to some embodiments, the semiconductor device further includes a second via penetrating through the fourth ILD layer. The second via is disposed within the transistor forming region to electrically connect with the first metal interconnect layer.

According to some embodiments, the first via and the second via are damascened copper vias.

According to some embodiments, the resistor comprises a patterned titanium nitride layer.

According to some embodiments, the semiconductor device further includes a patterned hard mask layer on the patterned titanium nitride layer.

According to some embodiments, the fourth ILD layer covers the patterned hard mask layer.

According to some embodiments, the patterned hard mask layer is a patterned silicon nitride layer.

According to some embodiments, the first via penetrates through the fourth ILD layer and the patterned hard mask layer.

According to some embodiments, the contact plug is a tungsten contact plug.

According to some embodiments, the first etch stop layer and the second etch stop layer are silicon nitride layers.

Another aspect of the invention provides a method for forming a semiconductor device. A substrate having a transistor forming region and a resistor forming region thereon is provided. A transistor is formed on the substrate within the transistor forming region. A first inter-layer dielectric (ILD) layer is formed to cover the transistor forming region and a resistor forming region and is disposed around the transistor. A first etch stop layer is formed on the first ILD layer. A second inter-layer dielectric (ILD) layer is formed on the first etch stop layer. A contact plug is formed in the second ILD layer, the first etch stop layer, and the first ILD layer to electrically connect with a terminal of the transistor. A third inter-layer dielectric (ILD) layer is formed on the second ILD layer. A first metal interconnect layer is formed in the third ILD layer and electrically connected to the contact plug. A second etch stop layer is formed on the third ILD layer. A resistor is formed on the second etch stop layer within the resistor forming region. A fourth inter-layer dielectric (ILD) layer is formed to cover the resistor and the second etch stop layer. A first via is formed in the fourth ILD layer to electrically connect with a terminal of the resistor.

According to some embodiments, a second via that penetrates through the fourth ILD layer within the transistor forming region is formed to electrically connect with the first metal interconnect layer.

According to some embodiments, the first via and the second via are damascened copper vias.

According to some embodiments, the resistor comprises a patterned titanium nitride layer.

According to some embodiments, a patterned hard mask layer is formed on the patterned titanium nitride layer.

According to some embodiments, the fourth ILD layer covers the patterned hard mask layer.

According to some embodiments, the patterned hard mask layer is a patterned silicon nitride layer.

According to some embodiments, the first via penetrates through the fourth ILD layer and the patterned hard mask layer.

According to some embodiments, the contact plug is a tungsten contact plug.

According to some embodiments, the first etch stop layer and the second etch stop layer are silicon nitride layers.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

One feature of the present invention is that the fabrication process of the embedded titanium nitride resistor is changed from the middle-end process (MEOL) to the back-end-of-line (BEOL), and the via connection structure of the embedded titanium nitride resistor and the tungsten plug connection structure of the transistor are in different layers, so when etching the via hole of the embedded titanium nitride resistor, there is a relatively larger tolerance for process differences, thereby increasing the etching process window of the contact plug and improved yield.

Figure 1:
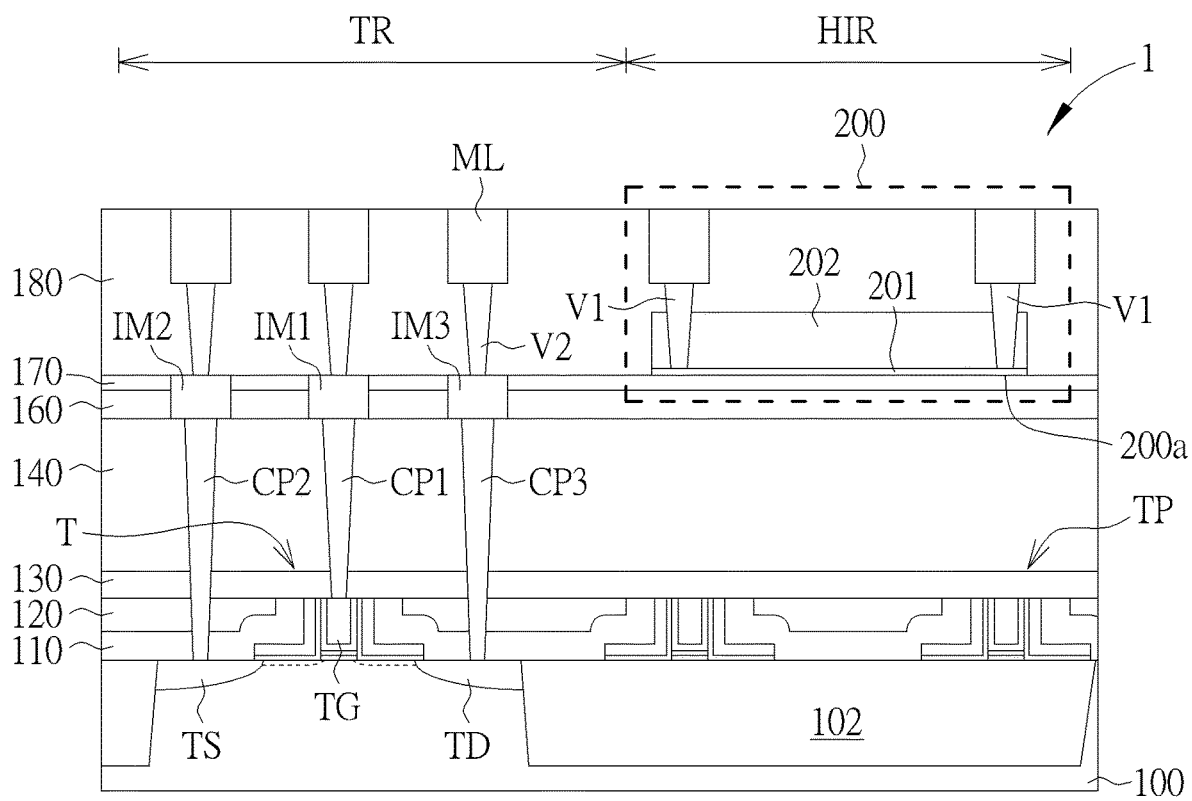
FIG. 1 is a schematic cross-sectional view of a semiconductor device according to an embodiment of the present invention.

Please refer to FIG. 1, which is a schematic cross-sectional view of a semiconductor device according to an embodiment of the present invention. As shown in FIG. 1, the semiconductor device 1 includes a substrate 100 having a transistor forming region TR and a resistor forming region HIR. According to an embodiment of the present invention, the substrate 100 may be a silicon substrate, but is not limited thereto. A transistor T is formed on the substrate 100 in the transistor forming region TR. According to an embodiment of the present invention, the transistor T may include a gate TG, a source doped region TS, and a drain doped region TD. According to an embodiment of the present invention, for example, the gate TG may be a metal gate. According to an embodiment of the present invention, the gate TG may be surrounded by the contact etch stop layer 110 and the interlayer dielectric layer 120.

According to an embodiment of the present invention, for example, the contact etch stop layer 110 may be a silicon nitride layer, and the interlayer dielectric layer 120 may be a silicon oxide layer or a low dielectric constant material layer, but is not limited thereto. According to an embodiment of the present invention, the top surface of the gate TG is flush with the top surface of the interlayer dielectric layer 120.

According to an embodiment of the present invention, the resistor forming region HIR is directly located on the trench isolation structure 102 of the substrate 100. According to an embodiment of the present invention, a semiconductor structure TP may be formed on the trench isolation structure 102, for example, a passing gate.

According to an embodiment of the present invention, the interlayer dielectric layer 120 covers the transistor forming region TR and the resistor forming region HIR and surrounds the transistor T. An etch stop layer 130 is formed on the interlayer dielectric layer 120. According to an embodiment of the present invention, for example, the etch stop layer 130 may be a silicon nitride layer. An interlayer dielectric layer 140 is formed on the etch stop layer 130. According to an embodiment of the present invention, for example, the interlayer dielectric layer 140 may be a silicon oxide layer or a low dielectric constant material layer, but is not limited thereto.

According to an embodiment of the present invention, contact plugs CP1 to CP3 are formed in the interlayer dielectric layer 140, the etch stop layer 130, and the interlayer dielectric layer 120, which are respectively electrically connected to the terminals of the transistor T: the gate TG, the source doped region TS and the drain doped region TD. According to an embodiment of the present invention, the contact plugs CP1 to CP3 are tungsten metal contact plugs. The contact plug CP1 penetrates through the interlayer dielectric layer 140 and the etch stop layer 130 and is electrically connected to the gate TG of the transistor T. The contact plug CP2 penetrates through the interlayer dielectric layer 140, the etch stop layer 130, the interlayer dielectric layer 120 and the contact etch stop layer 110 and is electrically connected to the source doped region TS of the transistor T. The contact plug CP3 penetrates through the interlayer dielectric layer 140, the etch stop layer 130, the interlayer dielectric layer 120 and the contact etch stop layer 110, and is electrically connected to the drain doped region TD of the transistor T.

According to an embodiment of the present invention, an interlayer dielectric layer 160 is formed on the interlayer dielectric layer 140. According to an embodiment of the present invention, metal interconnection layers IM1~IM3 are formed in the interlayer dielectric layer 160. The metal interconnection layers IM1~IM3 are disposed in the first metal layer and are electrically connected to the contact plugs CP1~CP3, respectively. According to an embodiment of the present invention, an etch stop layer 170 is formed on the interlayer dielectric layer 160. According to an embodiment of the present invention, the etch stop layer 130 and the etch stop layer 170 are silicon nitride layers.

According to an embodiment of the present invention, a resistor 200 is formed on the etch stop layer 170 in the resistor forming region HIR. According to an embodiment of the present invention, the resistor 200 includes a patterned titanium nitride layer 201. According to some embodiments of the present invention, the resistor 200 may include other high-resistance materials. According to an embodiment of the present invention, the patterned titanium nitride layer 201 directly contacts the etch stop layer 170. According to an embodiment of the present invention, the semiconductor device 1 further includes a patterned hard mask layer 202 on the patterned titanium nitride layer 201. According to an embodiment of the present invention, the patterned hard mask layer 202 is a patterned silicon nitride layer. According to some embodiments of the present invention, after the patterned titanium nitride layer 201 is formed, the patterned hard mask layer 202 may be removed.

According to an embodiment of the present invention, an interlayer dielectric layer 180 is further formed on the substrate 100 to cover the resistor 200 and the etch stop layer 170. According to an embodiment of the present invention, the interlayer dielectric layer 180 covers the patterned hard mask layer 202. According to an embodiment of the present invention, for example, the interlayer dielectric layer 180 may be a silicon oxide layer or a low dielectric constant material layer, but is not limited thereto. According to an embodiment of the present invention, vias V1 are formed in the interlayer dielectric layer 180 and are electrically connected to terminals 200a of the resistor 200. According to an embodiment of the present invention, the vias V1 penetrate through the interlayer dielectric layer 180 and the patterned hard mask layer 202.

According to an embodiment of the present invention, the semiconductor device 1 further includes metal interconnection layers ML and vias V2, which penetrate through the interlayer dielectric layer 180. The metal interconnection layers ML are disposed in the second metal layer. The metal interconnection layers ML and the vias V2 are located in the transistor forming region TR and are electrically connected to the metal interconnection layers IM1-IM3, respectively. According to an embodiment of the present invention, the vias V1 and the vias V2 are damascened copper vias.

Those skilled in the art should understand that the position of the resistor 200 in FIG. 1 is for illustration purpose only. FIG. 1 illustrates that the vias V1 of the resistor 200 and the vias V2 of the second metal layer (M2) are made at the same time. However, in some embodiments, the resistor 200 may be disposed in a higher interlayer dielectric layer. For example, the vias V1 of the resistor 200 and the vias (not shown) of the third metal layer (M3) are made at the same time. The vias of the resistor and the tungsten plug of the transistor are in different layers, so when forming the vias of the embedded titanium nitride resistor, there is a relatively larger tolerance for process differences.

Figure 2:
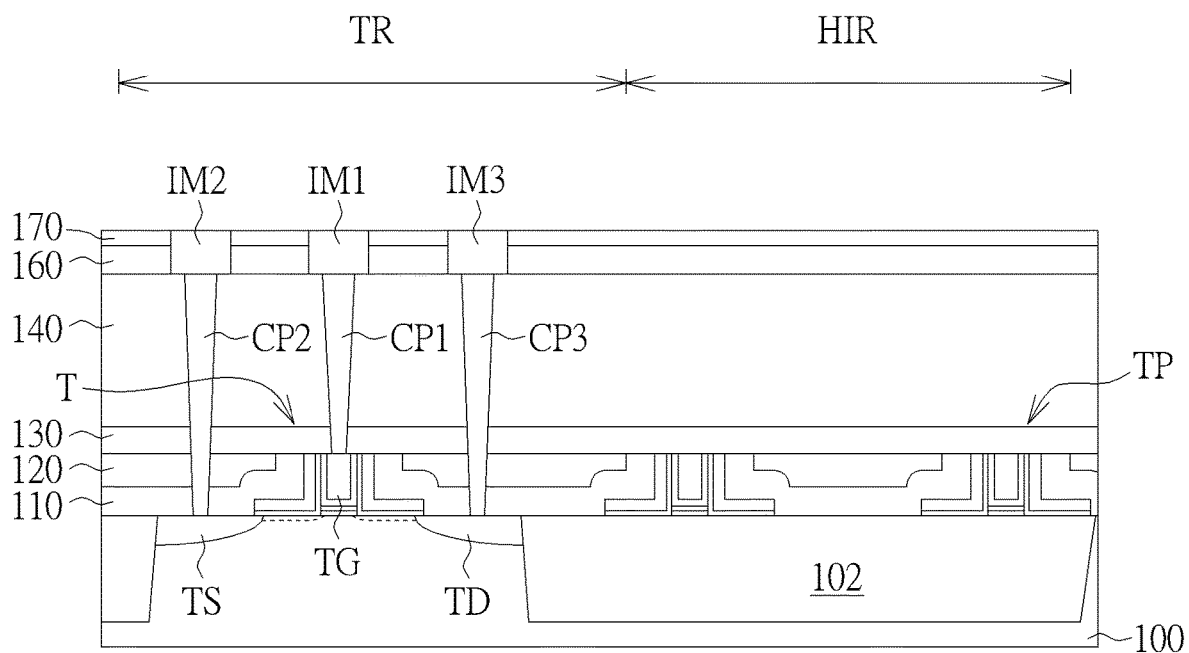
FIG. 2 and FIG. 3 are schematic diagrams showing an exemplary method for fabricating a semiconductor device according to an embodiment of the present invention.
Figure 3:
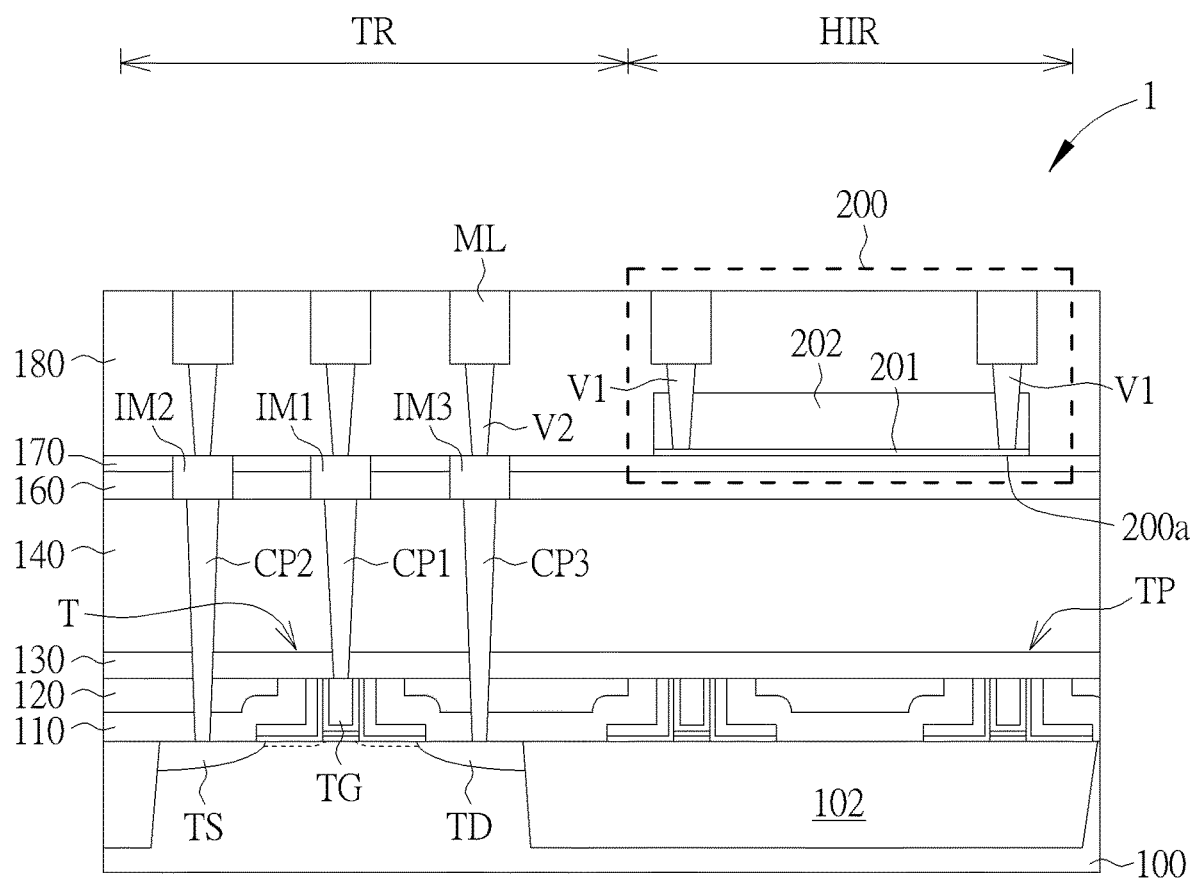

Please refer to FIG. 2 and FIG. 3, which are schematic diagrams of the manufacturing method of the semiconductor device according to an embodiment of the present invention. As shown in FIG. 2, first, a substrate 100 having a transistor forming region TR and a resistor forming region HIR is provided. A transistor T is formed on the substrate 100 in the transistor forming region TR. After the replacement metal gate (RMG) process and the chemical mechanical polishing (CMP) process, the interlayer dielectric layer 120 covers the transistor forming region TR and the resistor forming region HIR and surrounds the gate TG of the transistor T.

Next, an etch stop layer 130 is formed on the interlayer dielectric layer 120. Then, an interlayer dielectric layer 140 is formed on the etch stop layer 130. Contact plugs CP1-CP3 are formed in the interlayer dielectric layer 140, the etch stop layer 130, and the interlayer dielectric layer 120, which are respectively electrically connected to the terminals of the transistor T: the gate TG, the source doped region TS, and the drain doped region TD. According to an embodiment of the present invention, the contact plugs CP1~CP3 are tungsten metal contact plugs. An interlayer dielectric layer 160 is then formed on the interlayer dielectric layer 140. Metal interconnection layers IM1~IM3 are formed in the interlayer dielectric layer 160 to electrically connect the contact plugs CP1~CP3, respectively. An etch stop layer 170 is formed on the interlayer dielectric layer 160. According to an embodiment of the present invention, the etch stop layer 130 and the etch stop layer 170 are silicon nitride layers.

As shown in FIG. 3, a resistor 200 is formed on the etch stop layer 170 in the resistor forming region HIR. For example, the method of forming the resistor 200 includes depositing a titanium nitride layer in a blanket manner, and then patterning the titanium nitride layer by using a lithographic process and an etching process. According to an embodiment of the present invention, the resistor 200 includes a patterned titanium nitride layer 201. According to an embodiment of the present invention, the resistor 20 further includes a patterned hard mask layer 202 on the patterned titanium nitride layer 201. According to an embodiment of the present invention, the patterned hard mask layer 202 is a patterned silicon nitride layer.

After the resistor 200 is formed, an interlayer dielectric layer 180 is deposited to cover the resistor 200 and the etch stop layer 170. Then, vias V1 are formed in the interlayer dielectric layer 180 and the vias V1 are electrically connected to the terminals 200a of the resistor 200. According to an embodiment of the present invention, the vias V1 penetrates through the interlayer dielectric layer 180 and the patterned hard mask layer 202. According to an embodiment of the present invention, the interlayer dielectric layer 180 covers the patterned hard mask layer 202.

According to an embodiment of the present invention, vias V2 penetrating the interlayer dielectric layer 180 are formed in the transistor forming region TR and are electrically connected to the metal interconnection layers IM1~IM3. The vias V1, the vias V2, and the metal interconnection layer ML can be formed in the interlayer dielectric layer 180 through a dual damascene copper process. According to an embodiment of the present invention, the vias V1 and the vias V2 are damascened copper vias. Since the vias V1 of the resistor 200 and the contact plugs CP1~CP3 of the transistor are in different layers, when the vias of the resistor 200 is etched, there can be a relatively larger tolerance for process differences.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a substrate having a transistor forming region and a resistor forming region thereon;
a transistor disposed on the substrate within the transistor forming region;
a first inter-layer dielectric (ILD) layer covering the transistor forming region and the resistor forming region and around the transistor;
a first etch stop layer disposed on the first ILD layer;
a second inter-layer dielectric (ILD) layer disposed on the first etch stop layer;
a contact plug in the second ILD layer, the first etch stop layer, and the first ILD layer to electrically connect with a terminal of the transistor;
a third inter-layer dielectric (ILD) layer disposed on the second ILD layer;
a first metal interconnect layer disposed in the third ILD layer and being electrically connected to the contact plug;
a second etch stop layer disposed on the third ILD layer;
a resistor disposed on the second etch stop layer within the resistor forming region, wherein the resistor comprises a patterned titanium nitride layer, wherein the patterned titanium nitride layer is in direct contact with the second etch stop layer;
a fourth inter-layer dielectric (ILD) layer covering the resistor and the second etch stop layer; and
a first via disposed in the fourth ILD layer and being electrically connect with a terminal of the resistor.

2. The semiconductor device according to claim 1 further comprising:
a second via penetrating through the fourth ILD layer, wherein the second via is disposed within the transistor forming region to electrically connect with the first metal interconnect layer.

3. The semiconductor device according to claim 2, wherein the first via and the second via are damascened copper vias.

4. The semiconductor device according to claim 1 further comprising:
   a patterned hard mask layer on the patterned titanium nitride layer.

5. The semiconductor device according to claim 4, wherein the fourth ILD layer covers the patterned hard mask layer.

6. The semiconductor device according to claim 4, wherein the patterned hard mask layer is a patterned silicon nitride layer.

7. The semiconductor device according to claim 4, wherein the first via penetrates through the fourth ILD layer and the patterned hard mask layer.

8. The semiconductor device according to claim 1, wherein the contact plug is a tungsten contact plug.

9. The semiconductor device according to claim 1, wherein the first etch stop layer and the second etch stop layer are silicon nitride layers.

\* \* \* \* \*